(12) United States Patent
Reitsma

(10) Patent No.: US 10,483,953 B2
(45) Date of Patent: Nov. 19, 2019

(54) RING OSCILLATOR-BASED TIMER

(71) Applicant: TEXAS INSTRUMENTS INCORPORATED, Dallas, TX (US)

(72) Inventor: George Reitsma, Redwood City, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 11 days.

(21) Appl. No.: 15/891,032

(22) Filed: Feb. 7, 2018

(65) Prior Publication Data

US 2019/0245528 A1 Aug. 8, 2019

(51) Int. Cl.
*H03K 5/135* (2006.01)
*H03L 7/099* (2006.01)
*H03L 7/18* (2006.01)
*H03L 7/23* (2006.01)
*H03K 3/03* (2006.01)

(52) U.S. Cl.
CPC .......... *H03K 5/135* (2013.01); *H03K 3/0315* (2013.01); *H03L 7/0997* (2013.01); *H03L 7/18* (2013.01); *H03L 7/23* (2013.01)

(58) Field of Classification Search
CPC ..................................... H03K 5/135
USPC ........................................... 375/291
See application file for complete search history.

(56) References Cited

U.S. PATENT DOCUMENTS

| | | | | |
|---|---|---|---|---|
| 5,835,552 A | * | 11/1998 | Kusumoto | ........... G01R 29/027 377/24 |
| 2003/0137326 A1 | * | 7/2003 | Okada | ................. H03D 13/004 327/108 |
| 2011/0074398 A1 | * | 3/2011 | Barton | ............... G01R 19/0084 324/133 |

* cited by examiner

*Primary Examiner* — Lihong Yu
(74) *Attorney, Agent, or Firm* — John R. Pessetto; Charles A. Brill; Frank D. Cimino

(57) ABSTRACT

A circuit includes a ring oscillator and a state capture register to receive a multi-bit state of the ring oscillator captured upon occurrence of an edge of input periodic signal. The circuit also includes an edge-phase detector to assert an edge detect high signal in response to a first reference clock derived from the ring oscillator being high upon occurrence of the edge of the input periodic signal and to assert an edge detect low signal in response to the first reference clock derived from the ring oscillator being low upon occurrence of the edge of the input periodic signal. A first register receives data from the state capture register upon occurrence of one of a rising or falling edge of a second clock derived from the ring oscillator.

14 Claims, 9 Drawing Sheets

RING OSCILLATOR-BASED TIMER

BACKGROUND

Multiple applications benefit from the use of a timer. For example, some sensors produce a periodic signal based on a physical phenomenon. The frequency of the sensor output encodes a measurement of the physical phenomenon. To recover the measured value entails a determination of the frequency of the sensor's periodic signal. To determine the periodic signal's frequency, a timer can be used to measure the time for a complete cycle of the periodic signal. Other uses of electronic timers are prevalent as well. Some timers unfortunately consume a great deal of electrical power and may not be capable of measuring consecutive cycles of the periodic waveform.

SUMMARY

In one example, a circuit includes a ring oscillator and a state capture register to receive a multi-bit state of the ring oscillator captured upon occurrence of an edge of input periodic signal. The circuit also includes an edge-phase detector to assert an edge detect high signal in response to a first reference clock derived from the ring oscillator being high upon occurrence of the edge of the input periodic signal and to assert an edge detect low signal in response to the first reference clock derived from the ring oscillator being low upon occurrence of the edge of the input periodic signal. A first register receives data from the state capture register upon occurrence of one of a rising or falling edge of a second clock derived from the ring oscillator.

In accordance with another example, a circuit includes a ring oscillator and a register to receive a multi-bit state of the ring oscillator captured upon occurrence of an edge of input periodic signal. The circuit also includes a state encoder to read the multi-bit state from the register, invert some, but not, all of the bits of the state to produce a modified bit value, and concatenate a plurality of logic 0's or 1's to the modified bit value.

In accordance with another example, a circuit includes a ring oscillator, a state capture register, first and second registers, first and second encoders, and a selection circuit. The state capture register captures a state of the ring oscillator upon occurrence of an edge of an input periodic signal. The first register receives the captured state from the state capture register upon occurrence of one of a rising or falling edge of a first clock derived from the ring oscillator. The first state encoder reads data from the first register, inverts even numbered bits of the data read from the first register, and pads the data read from the first register, with the even numbered bits inverted, with a plurality of digital 1's. The second register receives the captured state from the state capture register upon occurrence of the other of the rising or falling edge of the first clock. The second state encoder reads data from the second register, inverts odd numbered bits of the data read from the second register, and pads the data read from the second register, with the odd numbered bits inverted, with a plurality of logic 0's. The selection circuit selects an output of the first state encoder or the second state encoder.

BRIEF DESCRIPTION OF THE DRAWINGS

For a detailed description of various examples, reference will now be made to the accompanying drawings in which.

DETAILED DESCRIPTION

This disclosure is directed to a ring oscillator-based timer. One use of the disclosed timer is to measure the period of a periodic signal and thus ascertain its frequency, although other uses of the disclosed timer are possible as well. In accordance with an example, the timer includes a ring oscillator. The state of the ring oscillator is used to determine the amount of time that elapses between two events. The events may be consecutive zero-crossing rising edges of a periodic waveform. The amount of elapsed time is a function of the frequency of the periodic waveform, and thus the frequency of the periodic waveform can be determined from the timer's elapsed time measurement. The periodic waveform may comprise an output signal from a sensor in some examples, but can any of a variety of other signals or events in other examples.

Figure 1:
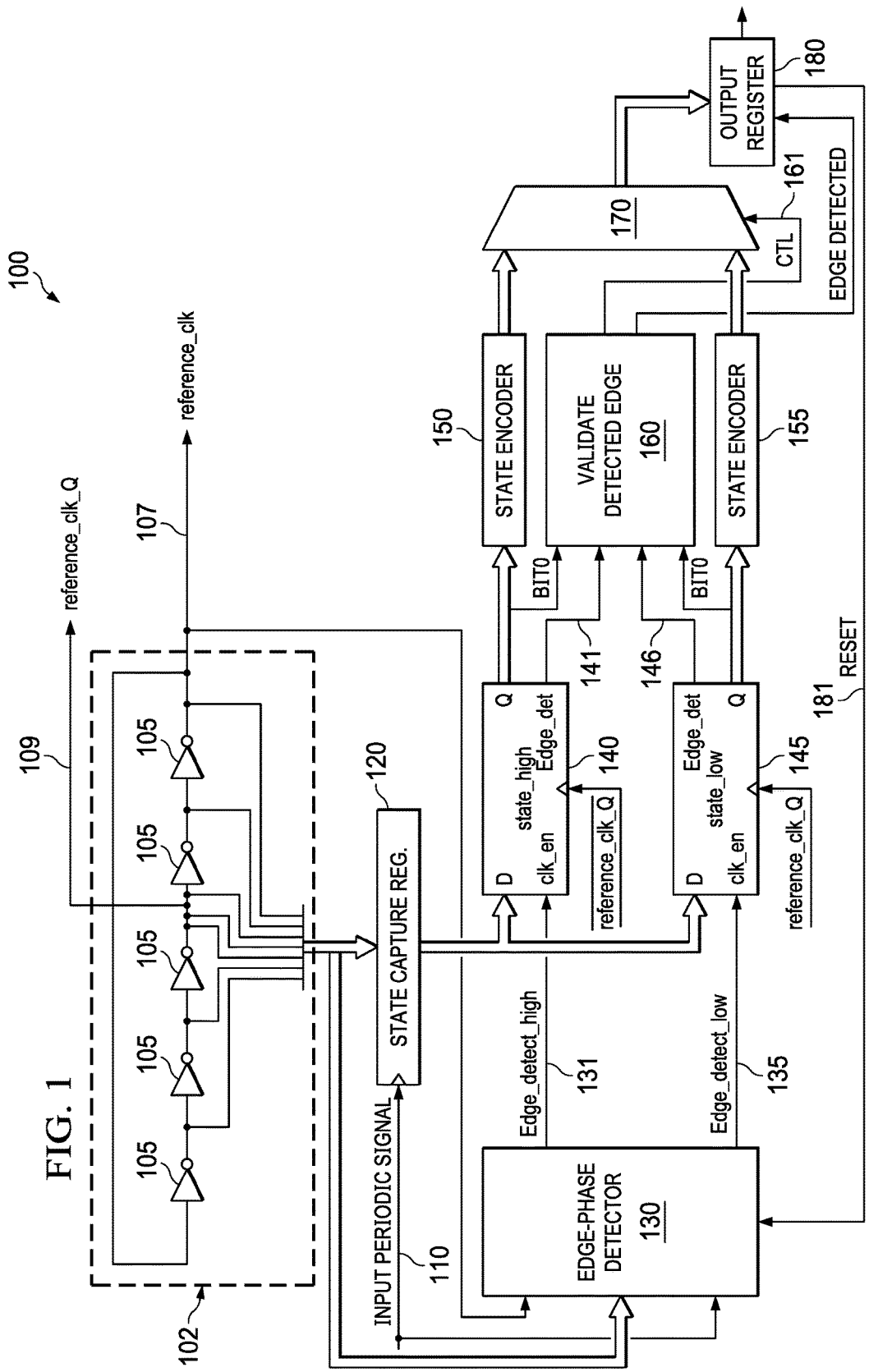
FIG. 1 illustrates at least a portion of a frequency timer in accordance with an example.

FIG. 1 shows an example of at least a portion of a ring oscillator-based timer 100. The disclosed ring oscillator-based timer 100 includes a ring oscillator 102, a state capture register 120, an edge-phase detector 130, a state high register 140, a state low register 145, state encoders 150 and 155, a validate detected edge circuit 160, selection circuit 170, and an output register 180. The ring oscillator 102 comprises multiple delay elements. In the example of FIG. 1, the ring oscillator 102 includes inverters 105 (either single-ended or differential inverters), but other types of delay elements can be used in instead of inverters. Each inverter 105 receives an input and, after a time delay, produces an output that is a logical inverse of the input. If the input is a logic high, then the output will be a logic low and if the input is a logic low, the output will be a logic high. The time delay of the inverter to generate its output upon a change in its input signal is readily determined or otherwise known. In some implementations, the ring oscillator 102 is part of a frequency locked loop (FLL) or a phase locked loop (PLL) that controls the delay of each inverter. In some examples, there are an odd number of inverters 105 in the ring oscillator and the inverters are serially connected in a ring configuration. Other examples include an even number of fully differential inverters used as the delay elements and one or more of the differential inverters are configured as non-inverting so that that the ring oscillator contains an odd number of inversions. A reference clock (reference_clk) 107 is derived from the ring oscillator 102. The reference clock 107 is the output signal from one of the inverters 105. A reference_clk_Q 109 also is derived from the ring oscillator, but from a different inverter that provides the reference_clk 107. The reference_clk_Q 109 may be a quadrature clock in that it is phase shifted by 90 degrees relative to reference_clk 107. Reference_clk 107 and reference_clk_Q 109 have the same frequency, but are time-shifted from each other as will be discussed below.

An input periodic signal 110 is provided to the state capture register 120. The input periodic signal 110 is a periodic signal whose frequency is to be determined using the ring oscillator-based timer 100. The ring oscillator-based timer 100 is used to measure the elapsed time of a period of the input signal. The input periodic signal 110 is used to clock the state capture register 120 to capture the state of the ring oscillator 102. The state of the ring oscillator 102 is the output signals from the various inverters 105 in the ring oscillator. The edge-phase detector 130 determines the state of reference_clk 107 upon occurrence of an edge (e.g., a zero-crossing rising edge) of the input periodic signal 110. The edge-phase detector 130 asserts (e.g., to a high logic level) an edge detect high signal 131 in response to reference_clk 107 being high upon occurrence of the edge of the input periodic signal 110. The edge-phase detector 130 asserts (e.g., to a high logic level) an edge detect low signal 135 in response to reference_clk 107 being low upon occurrence of the edge of the input periodic signal 110.

When enabled by the edge detect high signal 131, the state high register 140 reads the contents of the state capture register 120 upon occurrence of the next falling edge of reference_clk_Q 109 (as denoted by $\overline{\text{reference\_clk\_Q}}$) provided to the clock input of the state high register 140. Similarly, when enabled by the edge detect low signal 135, the state low register 145 reads the contents of the state capture register 120 upon occurrence of the next rising edge of reference_clk_Q 109 provided to the clock input of the state low register 145. Thus, in general one of the state high or state low registers 140, 145 reads the contents of the state capture register 120.

The use of reference_clk_Q 109 to transfer the contents of the state capture register 120 to the corresponding state high or low registers 140, 145 avoids any set up and hold timing problems which might otherwise occur as the input periodic signal 110 is used to control the timing of when the state capture 120 register captures the state of the ring oscillator 102, but a different clock domain (reference_clk_Q 109 derived from the ring oscillator 102) is used to control the timing of when the state capture register 120 is read by the state high/low registers 140, 145. A setup/hold timing violation might occur if the input periodic signal 110 were to clock the state capture register 120 when the state high/low register 140/145 was attempting to read the state capture register 120. Timing diagrams are provided herein and discussed below to further illustrate the timing benefit of using the reference_clk_Q 109.

State encoder 150 reads the ring oscillator state from the state high register 140, inverts the even numbered bits of the captured ring oscillator state data from state low register 140, and pads the resulting value with a plurality of logic 1's. This process is discussed below. Similarly, state encoder 155 reads the ring oscillator state from the state low register 145, inverts the odd numbered bits of the captured ring oscillator state data from state low register 145, and pads the resulting value with a plurality of logic 0's.

The validate detected edge circuit 160 is useful to detect a problem that can occur if the edges of the input periodic signal 110 and reference_clk 107 happen to be approximately aligned. As will be discussed below, if that happens, both the edge_detect_high signal 131 and the edge_detect_low signal 135 will be asserted high which, in turn, will cause both the state high and state low registers 140, 145 to read the state capture register 120. The state high register 140 captures the state of the edge_detect_high signal 131 and outputs that logic state as edge_det signal 141. Similarly, the state low register 145 captures the state of the edge_detect_low signal 135 and outputs that logic state as edge_det signal 146. The validate detected edge circuit 160 detects whether both of the edge_det signals 141, 146 are asserted high (indicative of edge alignment of the input periodic signal 110 and reference_clk 107). If that occurs, then the validate detected edge circuit 160 asserts a control signal (CTL) 161 to the selection logic 170 based on the state of the least significant bit (bit0) from at least one of the state high/low registers 140, 145. If bit0 is a "1" and edge_det 141 is a "1", then the validate detected edge circuit 160 asserts CTL to cause the selection circuit 170 to select the output of state encoder 150. If, however, bit0 is a "0" and edge_det 146 is a "1", then the validate detected edge circuit 160 asserts CTL to cause the selection circuit 170 to select the output of state encoder 155.

If the edge_det signals 141 and 146 are logically different (edge_det signal 141 is a "1" while edge_det signal 146 is a "0," or vice versa), then the validate detected edge circuit 160 asserts CTL 161 for the selection circuit 170 based on whichever edge_det signal 141, 146 is asserted high. If edge_det 141 is a "1" (and edge_det 146 is a "0"), then CTL 161 is asserted to cause the selection circuit 170 to select the output of state encoder 150. However, if edge_det 146 is a "1" (and edge_det 141 is a "0"), then CTL 161 is asserted to cause the selection circuit 170 to select the output of state encoder 155.

The selection circuit 170 may comprise a multiplexer. The output from selection circuit 170 is provided to output register 180 in the example of FIG. 1. Once the value from the appropriate state encoder 150 is captured into output register 180 through selection circuit 170, a reset signal (RESET) is asserted to cause the edge-phase detector 130 to be reset as discussed below. The modified ring oscillator state value can be read from the output register 180 and used to determine the period of the input periodic signal 110 as discussed below.

Figure 2:
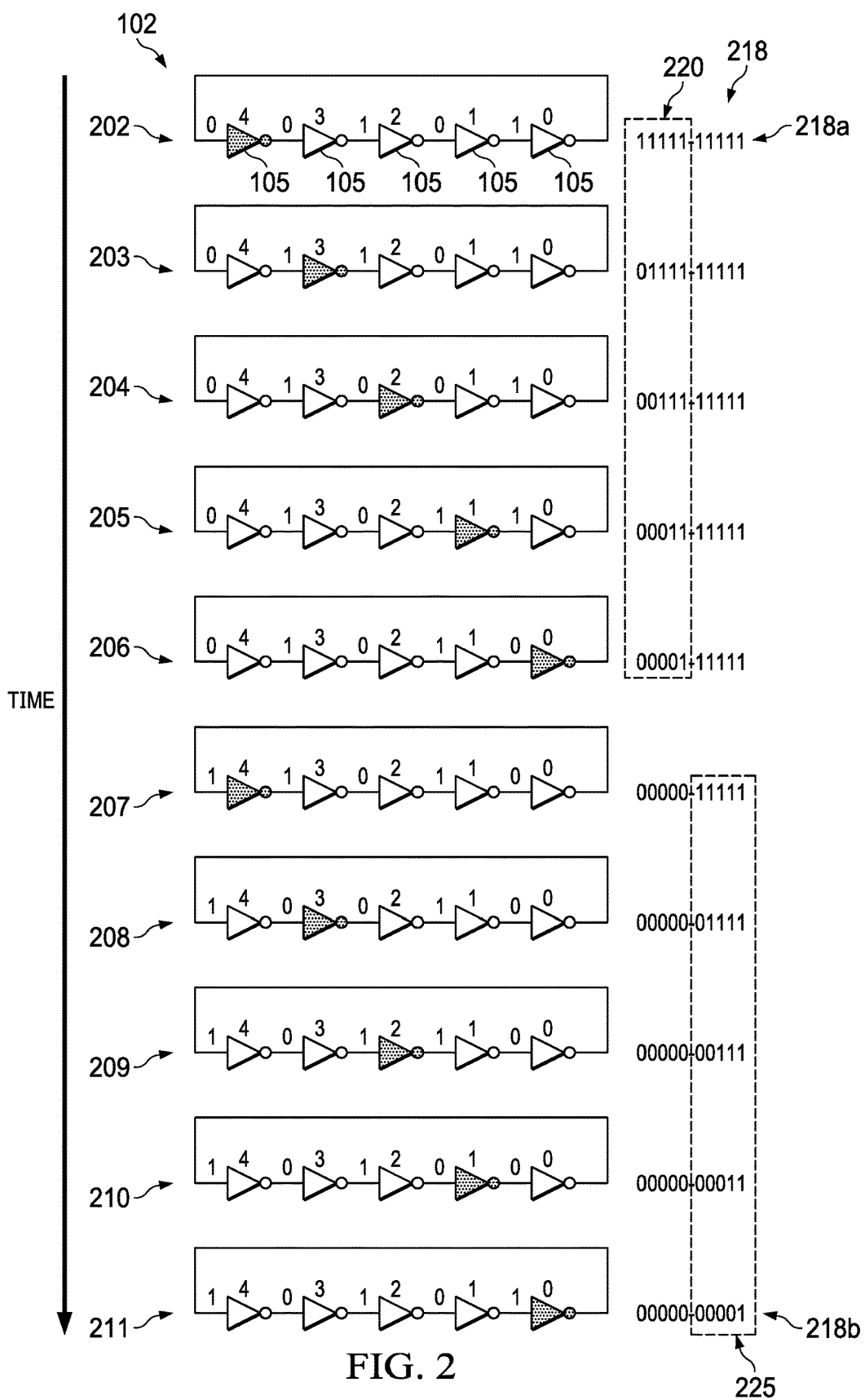
FIG. 2 illustrates an example of a time sequence of states of a ring oscillator included in the frequency timer of FIG. 1.

FIG. 2 shows an example of a time sequence of states 202-211 of the ring oscillator 102. In this example, the ring oscillator has five inverters 105. The inverters are numbered as shown including inverter 4, inverter 3, inverter 2, inverter 1, and inverter 0. The output from inverter 4 connects to input of inverter 3, the output of inverter 3 connects to the input of inverter 2, and so on, with the output of inverter 0 connected to the input of inverter 4, as shown. The advancement of time progresses vertically from the top of the figure to the bottom. At each point in time, the logic state of the inputs and outputs of the inverters 105 are shown. At each point in time, the output of one of the inverters is in the midst of changing logic states, while the other inverters are temporarily in a steady state. The inverter 105 that is in the process of changing is represented in gray. For example, at ring oscillator state 202, inverter 4's input is a logic 0 and its output is currently a logic 0 but will shortly change to logic 1, as illustrated at ring oscillator state 203. The logic state change of the output of inverter 4 also represents a change to the logic level of the input of inverter 3. At ring oscillator state 203, the input and output of inverter 3 are both logic 1, but the output of inverter 3 is in the process of changing to a logic 0, as illustrated in the state of the ring oscillator 102 at ring oscillator state 204. This process continues as shown through states 205, 206, 207, 208, 209, 210, and 211. From ring oscillator state 211, the next state of the ring oscillator reverts back to state 202.

The bits shown to the right of each ring oscillator state includes a code 218 that is derived from the ring oscillator 102. The bits circled at 220 are derived from the inverters 105 at ring oscillator states 202-206. The output of inverter 0 (the least significant bit, "LSB") is a logic 0 in this time sequence of ring oscillator states. With the LSB of the ring oscillator at a logic 0, the code for each ring oscillator state is formed as follows:

the output bit from the even numbered inverters (i.e., inverters 4, 2, and 0) are inverted;

the output from the odd numbered inverters (i.e., inverters 3 and 1) are taken as-is (not inverted); and the resulting 5-bit value is then padded with logic 1's following the bits derived from the ring oscillator.

For example, at ring oscillator state 202, the outputs of even numbered inverters 4, 2, and 0 are logic 0's and thus those bits are inverted to logic 1's. The output of the odd numbered inverters 3 and 1 are logic 1 and thus, the code is formed as "11111" with another set of logic 1's padded on to the end to thereby form the code "11111 11111". At ring oscillator state 203, the outputs of even numbered inverter 4 is a logic 1 and the output of inverters 2 and 0 are logic 0's. The output of the odd numbered inverters 3 and 1 are logic 1 and applying the above rules, the code is formed as "01111" with another set of logic 1's padded on to the end to thereby form the code "01111 11111."

The bits circled at 225 are derived from the inverters 105 at ring oscillator states 207-211. The LSB of the ring oscillator (output of inverter 0) is a logic 1 in this time sequence of ring oscillator states. With the LSB of the ring oscillator at a logic 1, the code for each ring oscillator state is formed as follows:

the output bit from the odd numbered inverters (i.e., inverters 3 and 1) are inverted;

the output from the even numbered inverters (i.e., inverters 4, 2, and 0) are taken as-is (not inverted); and the resulting 5-bit value is then padded with logic 0's prepended to the bits derived from the ring oscillator.

For example, at ring oscillator state 207, the outputs of odd numbered inverters 3 and 1 are logic 0's and thus those bits are inverted to logic 1's. The output of the even numbered inverters 4, 2, and 0 are logic 1's and thus, the code is formed as "11111" with another set of logic 0's prepended to the bits derived from the ring oscillator to thereby form the code "00000 11111". At ring oscillator state 208, the outputs of odd numbered inverter 3 and 1 are still logic 0's. The output of the even numbered inverter 4 is a logic 0 and the output of even numbered inverters 2 and 0 are logic 1's, and applying the above rules, the code is formed as "01111" with another set of logic 0's padded on the front end to thereby form the code "00000 01111."

As can be seen, the sequence of bits derived from the ring oscillator's state 202 ("11111") is the same as the sequence of bits derived from the state 207 (also "11111"). By padding the bits derived from the ring oscillator with additional bits, a unique code is formed for each of the states of the ring oscillator. The number of logic 1's in each code varies as shown. Code 218a has ten 1's while code 218b has only a single logic 1, and the codes in between 218a and 218 have a successively decreasing number of logic 1's (i.e., nine logic 1's, eight logic 1's, etc.). With five inverters 105 in the ring oscillator 102 in the example of FIG. 2, an additional set of five 1's and an additional set of five 0's is pre or post-padded to the bits derived from the ring oscillator 102. If a ring oscillator has a different number of inverters than five, the number of additional added bits will vary as well. For example, if the ring oscillator has 15 inverters, then an additional 15 bits of all 1's or all 0's will be added to the 15 bits derived from the 15 inverters of the ring oscillator.

Referring to FIGS. 1 and 2, the input periodic signal 110 is used to clock the state capture register 120 to thereby read the bits of the ring oscillator 102 (i.e., the state of the ring oscillator). The state of the ring oscillator is then transferred to one or both of the state high or low registers 140, 145. The state encoders 150, 155 perform the bit inversions described above. The state encoder 150 inverters the bits of the captured ring oscillator state that correspond to the even numbered inverters of the ring oscillator. The state encoder 155 inverters the bits of the captured ring oscillator state that correspond to the odd numbered inverters of the ring oscillator. As such, the output from one or the other of the state encoders 150, 155 represents the codes 218 shown in FIG. 2. The state encoder 150, 155 output that provides the correct code at any point in time is determined by the validate detected edge circuit 160, which then asserts CTL 161 to cause the selection circuit 170 to select the correct state encoder's output to be provided to output register 180.

The code output by the selection circuit 170 represents the ring oscillator state at the moment that the ring oscillator state was captured by the state capture register 120. The time delay of each inverter 105 in the ring oscillator is known apriori and thus the time required for the ring oscillator to transition through all of its states (i.e., from state 202 to state 211) is known. Each state 202-211 represents the state of the ring oscillator after one inverter delay relative to the next higher or lower state. The time required to cycle through all ten states 202-211 is ten times the time delay of one inverter. As such, by capturing the state of the ring oscillator at the same point in consecutive cycles of the input periodic signal (e.g., at the zero-crossing point during a rising edge), the period of the input periodic signal cycle can be determined. The frequency of the input periodic signal can then be determined once its period is known—the inverse of the period is the frequency.

Figure 3:
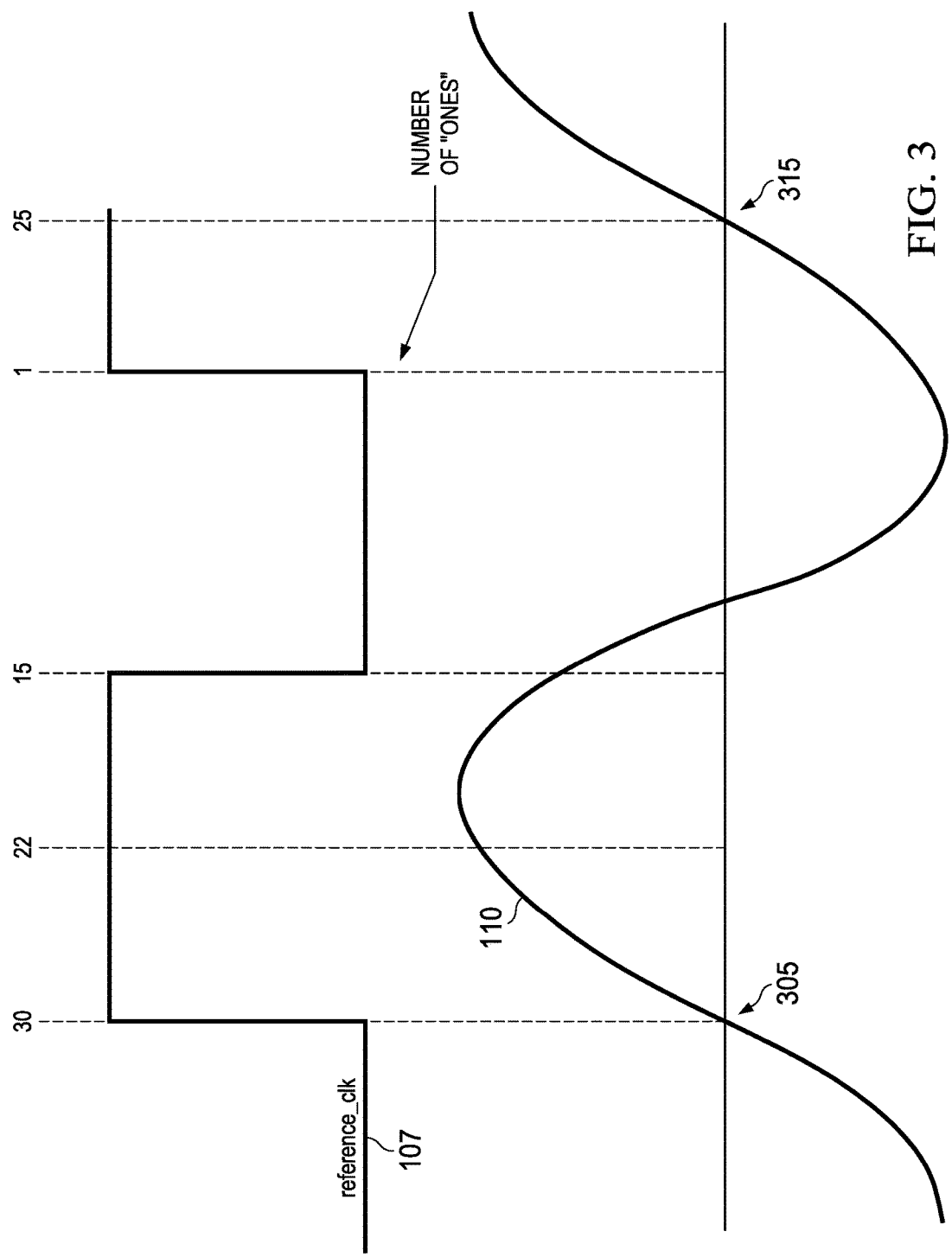
FIG. 3 illustrates the relationship between an input periodic signal and a reference clock derived from the ring oscillator in accordance with an example.

FIG. 3 shows an example of an input periodic signal 110. The reference_clk 107 from FIG. 1 also is shown. Reference_clk 107 represents the LSB of the ring oscillator 102 (i.e., the output of inverter 0). As can be seen from FIG. 2, the LSB is logic 0 for half of the ring oscillator states (i.e., ring oscillator states 202-206) and a logic 1 for the other half of the ring oscillator states (i.e., ring oscillator states 207-211). Because the ring oscillator pattern shown in FIG. 2 is repetitive, the LSB represents a square wave over time. Time period T1 is the period of the LSB and is the amount of time required to make one cycle through all of the codes 218. The LSB is a relatively low frequency clock (i.e., lower frequency compared to the rate at which ring oscillator changes state meaning that in the time the ring oscillator changes ten states from 202-211, the LSB has only changed state once).

As noted above and shown in FIG. 2, the number of logic 1's varies between each ring oscillator state. In the example of FIG. 3, the number of logic 1's varies from 1 to 30. In this example, the ring oscillator has 15 inverters and thus each code is 30 bits long, not 10 bits as shown in the example of FIG. 2. During the course of one complete cycle of the LSB waveform (reference_clk 107), the number of logic 1's in the codes for a 30-inverter ring oscillator vary from 1 to 30 as shown.

Reference numbers 305 and 315 represent zero-crossing points for consecutive rising edge of the input periodic signal 110. The code is read from the ring oscillator as describe above. The code at zero-crossing point 305 is 30 (i.e., the number of logic 1's in the code), while the code at zero-crossing point 315 is 25. That is, the code (in terms of the number of logic 1's) decreased from 30 down to 1, then jumped back to 30 and again decreased down to 25 during one complete cycle of the input periodic signal 110. As such, there are 35 code changes between zero-crossing points 305 and 315. The time difference between consecutive codes is the time delay of an individual inverter 105, and thus the period of the input periodic signal 110 (T1) is 35 times the time delay of a single inverter 105. In general the elapsed time between two events equals 30 times the number of complete reference_clk 107 cycles between the two events plus the number of ones in the second captured ring state minus the number of ones in the first captured ring state. As noted above, the number of codes derived from the ring oscillator is twice the number of delay elements in the ring oscillator.

Figure 4:
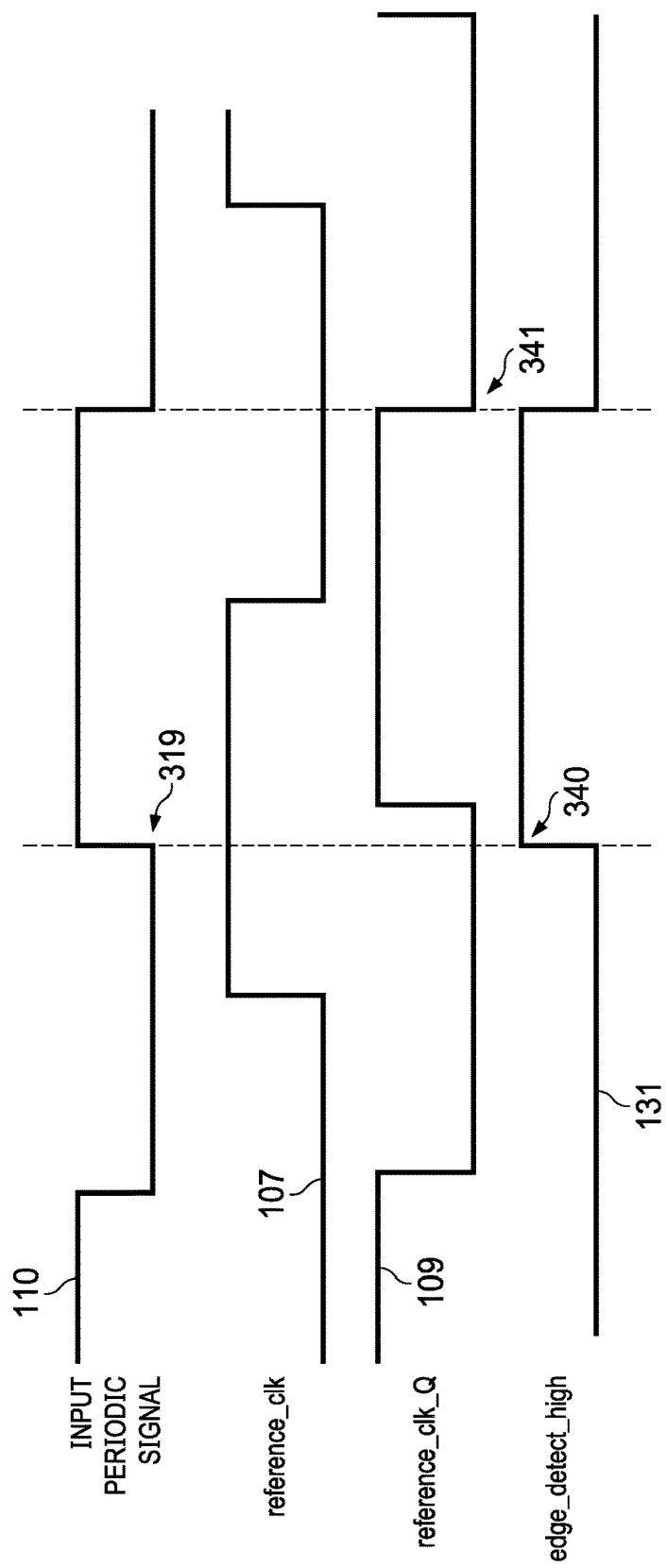
FIG. 4 shows a timing diagram in which the reference clock is logic high upon occurrence of an edge of the input periodic signal.

FIG. 4 shows an illustrative timing diagram. The input periodic signal 110 is shown as a square wave in this example, but it could be a sinusoidal waveform or other periodic waveform shape in other examples. The reference_clk 107 also is shown along with reference_clk_Q 109 from FIG. 1. As explained above, reference_clk 107 represents the LSB (inventor 0) from the ring oscillator 102. Reference_clk_Q 109 is the output of a different inverter, and thus has the same period and frequency as reference_clk 107 but is time (phase)-shifted compared to reference_clk 107 (for example, by approximately 90 degrees). In a five-inverter ring oscillator 102, the output of inverter 2 may provide reference_clk_Q 109 while the output of inverter 0 provides reference_clk 107. Other inverters can be used to generate the reference_clk_Q 109 signal.

The edge-phase detector 130 detects an edge (e.g., a rising edge) of the input periodic signal 110 and asserts either the edge_detect_high signal 131 or the edge_detect_low signal 135 based on the state of reference_clk 107 when the edge is detected of the input periodic signal 110. In the example timing diagram of FIG. 4, reference_clk 107 is high upon occurrence of edge 319 of the input periodic signal. In response to reference_clk 107 being high when edge 319 occurs, the edge-phase detector 130 asserts edge_detect_high 131 high at 340. Edge_detect_high 131 being high enables the state high register 140 to read the ring oscillator state from the state capture register 120 upon a high to low transition of the reference_clk_Q signal 109 which equates to a low to high transition of reference_clk_Q (generated by inverting reference_clk_Q).

The high to low transition of the reference_clk_Q signal 109 occurs at 341 in FIG. 4. Clocking the state high register 140 using a subsequent edge of reference-clk_Q avoids a violation of the setup and hold timing requirement to read the state capture register 120. That is, the use of the falling edge 341 of reference_clk_Q (which occurs after rising edge 319 of the input periodic signal 110) ensures that the input periodic signal 110 does not trigger the state capture register 120 to capture the next state of the ring oscillator 102 during the setup and hold time associated with the state high register 140. As such, the state of the ring oscillator 102 is captured into the state capture register 120 at 319, but not transferred from the state capture register 120 to the state high register 140 until edge 341.

Figure 5:
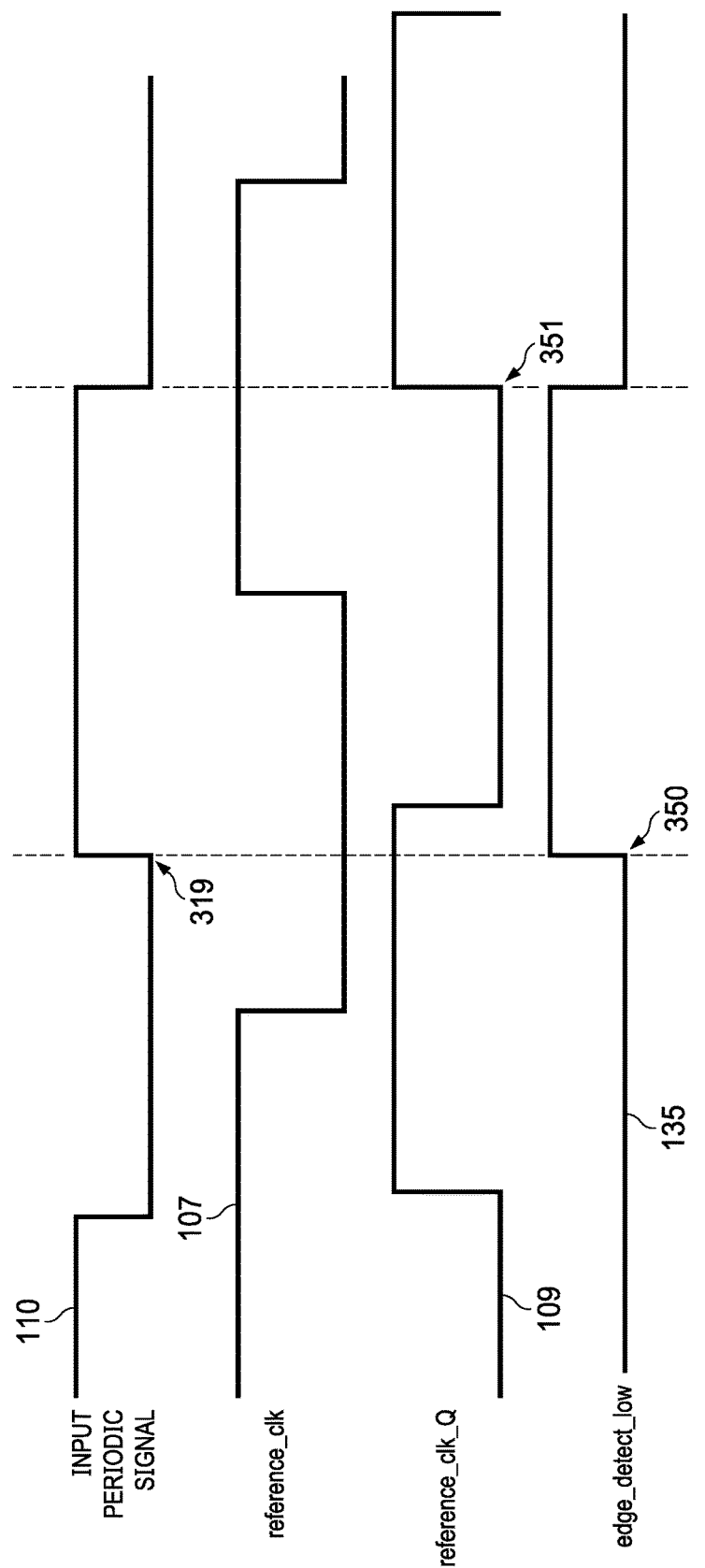
FIG. 5 shows a timing diagram in which the reference clock is logic low upon occurrence of an edge of the input periodic signal.

FIG. 5 shows a timing diagram example in which reference_clk 107 is low upon occurrence of edge 319 in the input periodic signal 110. In response to reference_clk 107 being low when edge 319 occurs, the edge-phase detector 130 asserts edge_detect_low 135 high at 350. Edge_detect_low 135 being high enables the state low register 145 to read the ring oscillator state from the state capture register 120 upon a low to high transition of the reference_clk_Q signal 109 which occurs at 351. As for the example of FIG. 5, the use of the rising edge of reference_clk_Q at 351 helps to avoid a setup and hold timing violation as discussed above.

Figure 6:
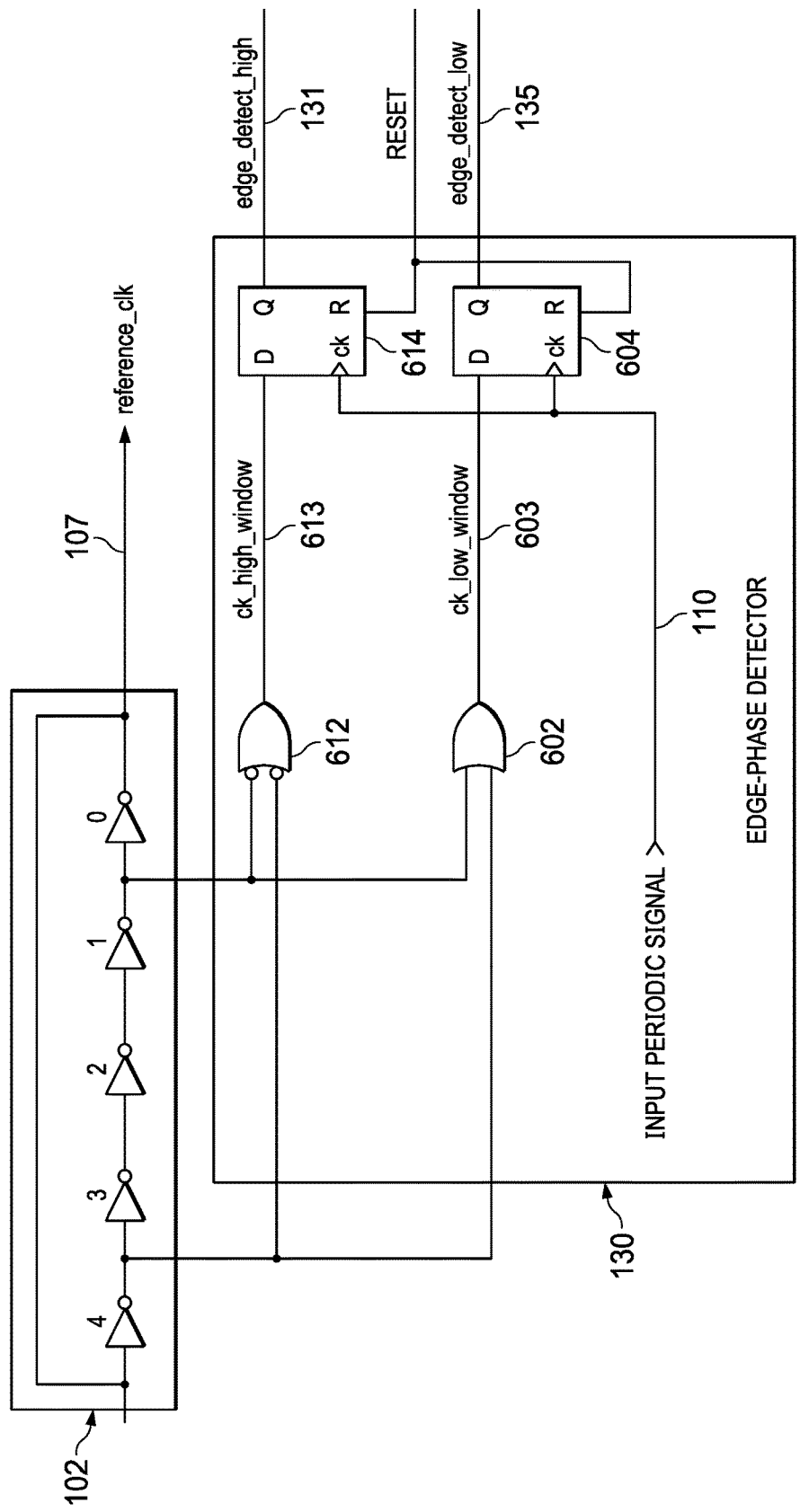
FIG. 6 illustrates an example of an edge-phase detector of the example frequency timer of FIG. 1.
Figure 7:
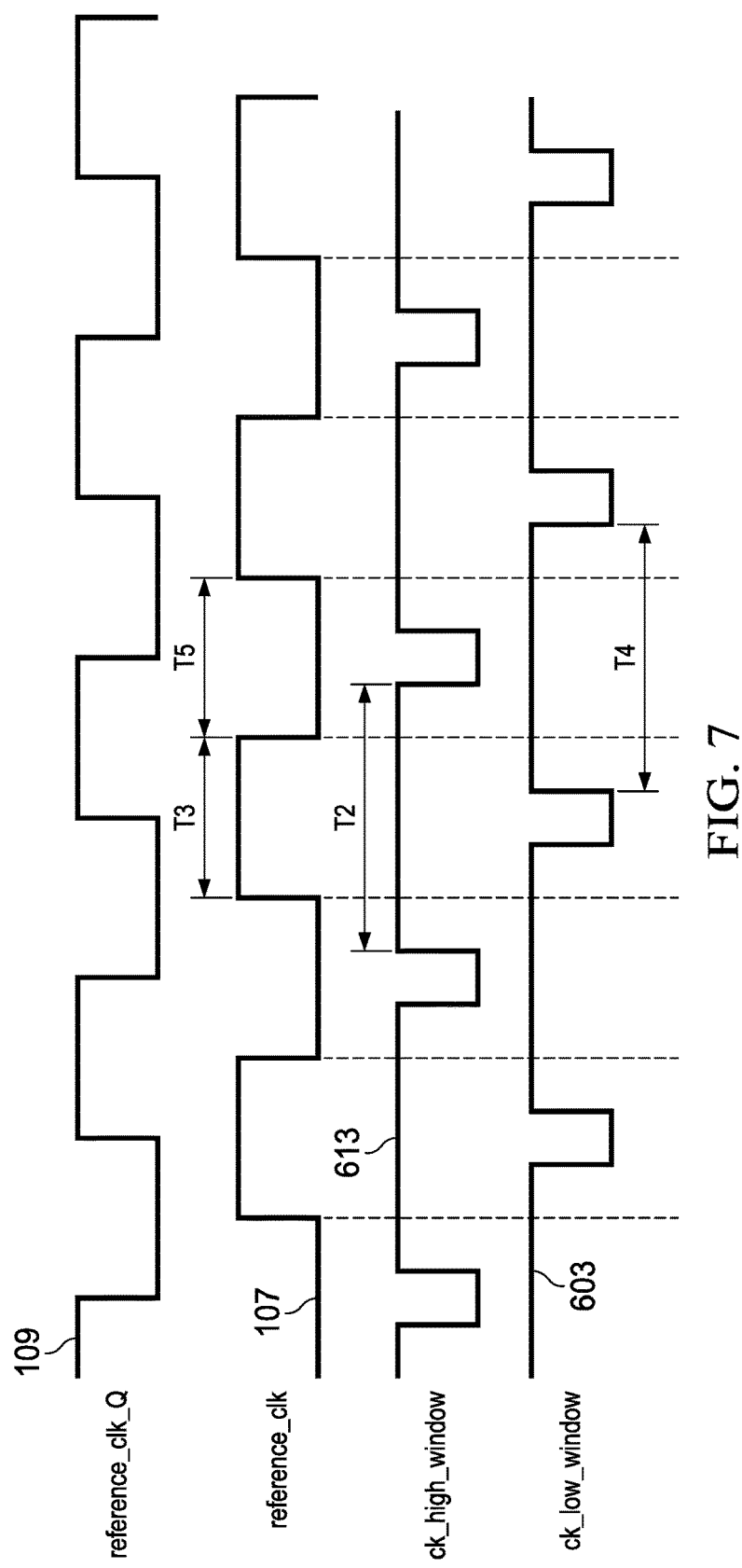
FIG. 7 is a timing diagram illustrative of the operation of the edge-phase detector of FIG. 6.

In the examples of FIGS. 4 and 5, the logic state (high or low) of reference_clk 107 is determined upon occurrence of a rising edge of 319 of the input periodic signal 110. Referring to FIGS. 6 and 7, to ensure that in the event that the rising edge of the input periodic signal 110 coincides with either a rising or falling edge of the reference_clk 107, no setup or hold time violation occurs inside the Edge_phase detector 130, a stretched version of the reference clock (ck_high_window 613) and a stretched version of the inverted reference clock (ck_low_window 603) is created. The rising edges of ck_high_window 613 signal occur well before the rising edges of the reference_clk 107 and ck_high_window 613 stays high well beyond the falling edge of the reference_clk 107. The extension of ck_high_window 613 high beyond the rising and falling edges of reference_clk 107 is more than the setup time of a flip flop that is used to detect the Edge_detect_high event. In a similar fashion, the ck_low_window 603 is stretched beyond the falling and rising of the low time of reference_clk 107.

By stretching ck_high_window 613 and ck_high_window 603, it is guaranteed that if the rising edge of the periodic input signal 110 coincides with reference_clk 107 being high, the Edge_detect_high signal 131 will be asserted. And if the rising edge of the periodic input signal 110 coincides with reference_clk 107 being low, the Edge_detect_low signal 135 will be asserted. However, ck_high_window 613 is low well before and after a falling edge of reference_clk_Q 109 to guarantee that the state high register 140 does not capture data from the state capture register 120 at a rising edge of the input periodic signal 110. Similarly ck_low_window 603 is low well before and after a rising edge of reference_clk_Q 109 to guarantee that the state low register 145 does not capture data from the state capture register 120 during a rising edge event of the input periodic signal 110. Because of the stretching of ck_high_window 613 and ck_high_window 603, it is possible that Edge_detect_high 131 is asserted while reference_clk 107 is low and Edge_detect_low 135 is asserted while reference_clk 107 is high. The validate detected edge circuit 160 will ensure that the correct state encoder output is captured during these events.

Thus, in some implementations (such as in the example of FIG. 6), rather than directly using the reference_clk 107 to generate the Edge_detect_high signal 131 and the Edge_detect_low signal 135, signals derived from the ring oscillator 102 that are proxies for the logic state of reference_clk 107 are used. FIG. 6 shows an example of an implementation of the edge-phase detector 130. The edge-phase detector 130 in this example includes OR gates 602 and 612 and flip flops 604 and 614. OR gate 602 includes inputs that couple to two of the inverters 105 of the ring oscillator 102 and a Q output that couples to a data input (D) of flip flop 604. Through the OR gate 602, two of the inverters' outputs (inverters 1 and 4) are logically OR'd together. The particular inverters 105 selected to be OR'd together are selected such that the output signal from the OR gate 602 (designated as ck_low_window 603) is a logic high for a period of time that encompasses the time during which reference_clk 107 is low and is a longer period of time than the time during which reference_clk 107 is low. As such, ck_low_window 603 is an inverted and stretched out version of the logic low phase of reference_clk 107.

Similarly, OR gate 612 includes inverted inputs that couple to two of the inverters 105 of the ring oscillator 102 (inverters 1 and 4) and an output Q that couples to a data input D of flip flop 614. Through the OR gate 612, two of the inverters' outputs) are logically OR'd together. The particular inverters 105 selected to be OR'd together are selected such that the output signal from the OR gate 612 (designated as ck_high_window 613) is a logic high for a period of time that encompasses the time during which reference_clk 107 is high and is a longer period of time than the time during which reference_clk 107 is high. As such, ck_high_window 613 is a stretched out version of the logic high phases of reference_clk 107 and is stretched out larger than the setup time of the flip flops 602 and 612.

The flip flops 604 and 614 are clocked via the input periodic signal 110. Upon occurrence of a rising edge of the input periodic signal 110, each flip flop 614, 604 asserts its Q output to be the logic state of its respective D input. The output signal from flip flop 604 is Edge_detect_low 135 and the output signal from flip flop 614 is Edge_detect_high 131. Once the ring oscillator state has been read from the state capture register 120 into the corresponding state high or low register 140, 145 based, in part, on the signals edge_detect_high 131 and edge_detect_low 135 from the edge-phase detector 130, and the validate detected edge circuit 160 has asserted the CTL 161 to cause the selection circuit 170 to select the output from the correct state encoder 155, 160 to be read into output register 180, the output register 180 asserts the reset signal RESET 181 to the reset inputs R of the flip flops 604, 614 to thereby reset the flip flops.

FIG. 7 shows a timing diagram for the reference_clk_Q, reference_clk 107, ck_high_window 613, and ck_low_window 603. As can be seen in this example, the ck_high_window 613 is high for a period of time T2 that is longer than the time T3 that reference_clk 107 is high, and the time during which ck_high_window 613 is high includes the time during which reference_clk 107 is high. Further, ck_low_window 603 is high for a period of time T4 that is longer than the time T5 that reference_clk 107 is low, and the time during which ck_low_window 603 is high includes the time during which reference_clk 107 is low. In some implementations, the time period T3 (reference_clk 107 is high) may be substantially equal to timer period T5 (reference_clk 107 is low), and correspondingly, T2 is substantially equal to T4. In other implementations, T3 is not equal to T5, in which case T2 is not equal to T4.

It is possible that both ck_high_window 613 and ck_low_window 603 are high upon occurrence of an edge 319 of the input periodic signal 110. When that occurs, both Edge_detect_high 131 and Edge_detect_low 135 will be asserted high by flip flops 614 and 604, respectively. The Edge_det outputs of the state high and low registers 140, 145 represent the logic state of Edge_detect_high 131 and Edge_detect_low 135, respectively, and thus both Edge_det 141 and 146 will be asserted high by the state high and low registers 140, 145. To determine which state encoder's output to use as the code derived from the ring oscillator for determining the frequency of the input periodic signal 110, the validate detected edge circuit 160 uses the state of the LSB of the ring oscillator (bit0, FIG. 1) read from the state capture register 120. If bit0 is a logic 1 and Edge_det 141 (146) is also a logic 1, then Edge_detect_low 135 is regarded as invalid and the validate detected edge circuit 160 asserts CTL to select the output from state encoder 150 which will have inverted the even numbered bits of the ring oscillator's state as explained above. If, however, bit0 is a logic 0 and Edge_det 141 (146) is also a logic 1, then Edge_detect_high 131 is regarded as invalid and the validate detected edge circuit 160 asserts CTL to select the output from state encoder 155 which will have inverted the odd numbered bits of the ring oscillator's state.

Figure 8:
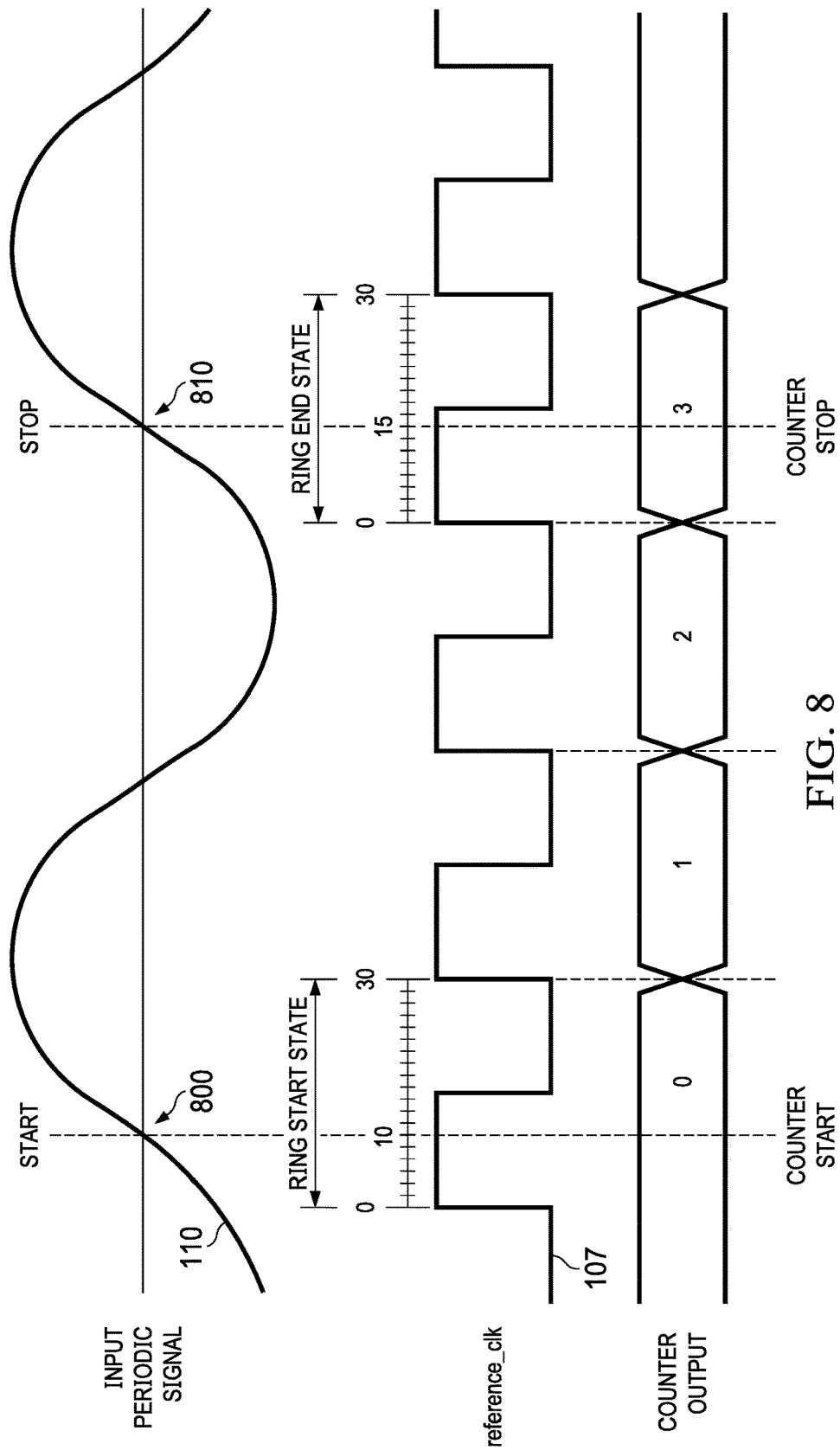
FIG. 8 is a timing diagram illustrating the use of the frequency timer to measure the frequency of an input periodic signal in accordance with an example.
Figure 9:
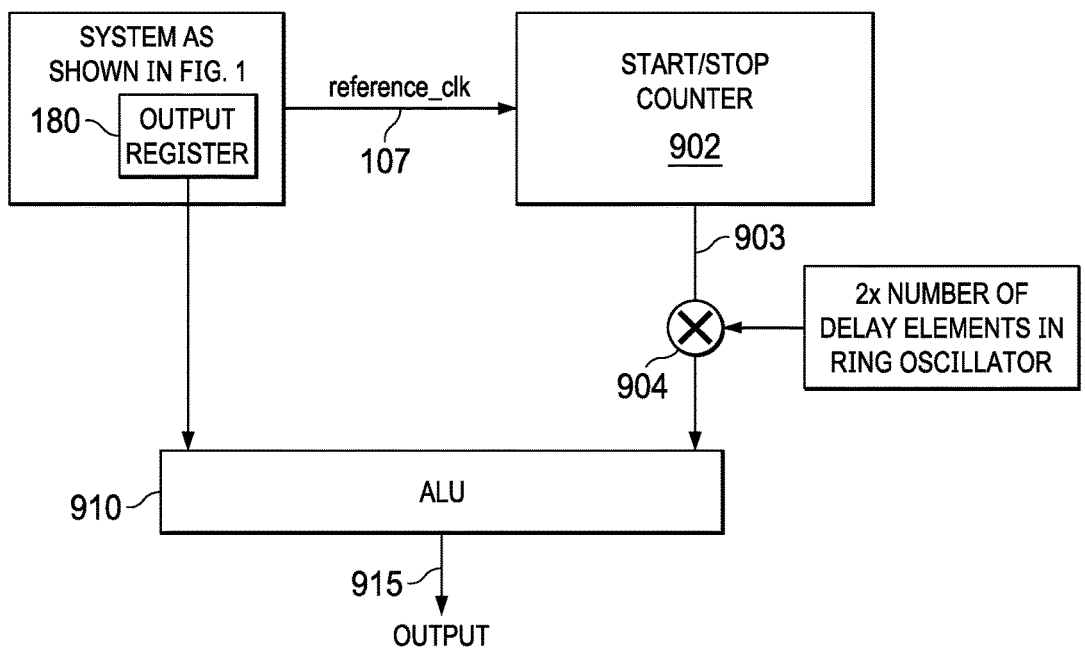
FIG. 9 illustrates an example of the use of a counter and an arithmetic logic unit to measure the frequency of an input periodic signal.

FIGS. 8 and 9 shows an example of the determination of frequency of the input periodic signal 110. FIG. 8 shows a timing diagram and FIG. 9 shows a corresponding system. The system of FIG. 9 includes a start/stop counter 902 and an arithmetic logic unit (ALU) 910 coupled to the illustrative system of FIG. 1. A multiplier 904 also is shown. FIG. 8 illustrates an example of the input periodic signal 110 and two zero crossing points 800 and 810 are depicted. The start/stop counter 902 counts cycles (e.g., rising edges) of the reference_clk 107. The start/stop counter 902 is initialized to a value of 0 and its output count value 903 is incremented with each successive reference_clk 107 rising edge. In the example of FIGS. 8 and 9, the ring oscillator includes 15 delay elements and thus 30 codes are derived from the ring oscillator states.

As can be seen in the example of FIG. 8, zero crossing point 800 occurs coincident with code 10 (meaning that there were ten 1's in the code generated from the ring oscillator at crossing point 800). The zero crossing point 810 results in code 15 (meaning that there were fifteen 1's in the code generated from the ring oscillator at crossing point 810). Further, the start/stop counter 902 has incremented its count value to "3" by the time zero crossing point 810 occurs. As such, the elapsed number of delay element delays between zero crossing points 800 and 810 is, as explained above, 30*3+15−10=95. Each delay element corresponds to a known period of time and that particular time value multiplied by 95 results provides the period of a single cycle of the input periodic signal 110, which can be converted to frequency as desired (1/period=frequency).

The ALU 910 and the multiplier 904 in the example of FIG. 9 are used to perform the math noted above. The output 915 of the ALU 910 may the number of delay elements delays between crossing points 800 and 810, the computed period of the input periodic signal 110, or the frequency of the input periodic signal 110.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a ring oscillator;
   a state capture register, coupled to the ring oscillator, to capture a state of the ring oscillator upon occurrence of an edge of an input periodic signal;
   an edge-phase detector to assert an edge detect high signal in response to a first reference clock derived from the ring oscillator being high upon occurrence of the edge of the input periodic signal and to assert an edge detect low signal in response to the first reference clock derived from the ring oscillator being low upon occurrence of the edge of the input periodic signal; and
a first register to receive data from the state capture register upon occurrence of one of a rising or falling edge of a second clock derived from the ring oscillator;
further comprising:
   a first state encoder, coupled to the first register, to read data from the first register, invert even numbered bits of the data read from the first register, and pad the data read from the first register, with the even numbered bits inverted, with a plurality of logic '1's;
   a second register to receive data from the state capture register upon occurrence of the other of the rising or falling edge of the second clock; and
   a second state encoder, coupled to the second register, to read data from the second register, invert odd numbered bits of the data read from the second register, and pad the data read from the second register, with the odd numbered bits inverted, with a plurality of logic '0's.

2. The circuit of claim 1, further comprising a selection circuit to select an output of the first state encoder or an output of the second state encoder.

3. The circuit of claim 2, further comprising validate detected edge circuit to generate a control signal for the selection circuit to select outputs of the first or second state encoders based on:
   a state of the least significant bit from at least one of the first or second registers;
   the edge detect high signal; and
   the edge detect low signal.

4. A circuit, comprising:
   a ring oscillator;
   a state capture register, coupled to the ring oscillator, to capture a state of the ring oscillator upon occurrence of an edge of an input periodic signal;
   an edge-phase detector to assert an edge detect high signal in response to a first reference clock derived from the ring oscillator being high upon occurrence of the edge of the input periodic signal and to assert an edge detect low signal in response to the first reference clock derived from the ring oscillator being low upon occurrence of the edge of the input periodic signal; and
   a first register to receive data from the state capture register upon occurrence of one of a rising or falling edge of a second clock derived from the ring oscillator;
   wherein the ring oscillator comprises a plurality of delay elements, and the circuit further comprises;
   a first logic gate including first and second inputs and a first output, wherein the first input is coupled to an output of a first delay element and the second input is coupled to an output of a second delay element; and
   a second logic gate including third and fourth inputs and a second output, wherein the third input is coupled to an output of a third delay element and the fourth input is coupled to an output of a fourth delay element;
   wherein the edge-phase detector comprises:
      a first flip flop including a first flip flop data input and a first clock input, wherein the first flip flop data input is coupled to the first output of the first logic gate and the first clock input is to receive the input periodic signal; and
      a second flip flop including a second flip flop data input and a second clock input, wherein the second flip flop data input is coupled to the second output of the second logic gate and the second clock input is to receive the input periodic signal.

5. A circuit, comprising:
   a ring oscillator;
   a register to receive a multi-bit state of the ring oscillator captured upon occurrence of an edge of an input periodic signal; and
   a state encoder to read the multi-bit state from the register, invert some, but not all, of the bits of the state to produce a modified bit value, and concatenate a plurality of logic '0's or '1'3 to the modified bit value;
   wherein the register is a first register and the state encode is a first state encoder,
      wherein, upon occurrence of one of a rising or falling edge of a second clock derived from the ring oscillator, the first register is to receive the multi-bit state of the ring oscillator;
      wherein the first state encoder is to read the multi-bit state from the first register, invert even numbered bits of the multi-bit state read from the first register, and pad the multi-bit state read from the first register, with the even numbered bits inverted, with a plurality of logic '1's;
      wherein the circuit further includes a second register to receive the multi-bit state from the state capture register upon occurrence of the other of the rising or falling edge of the second clock; and
      wherein the circuit further includes a second state encoder to read the multi-bit state from the second register, invert odd numbered bits of the multi-bit state read from the second register, and pad the multi-bit state read from the second register, with the odd numbered bits inverted, with a plurality of logic '0's.

6. The circuit of claim 5, further comprising a selection circuit to select an output of the first state encoder or an output of the second state encoder.

7. The circuit of claim 6, further comprising a validate detected edge circuit to generate a control signal for the selection circuit to select outputs of the first or second state encoders based on a state of a least significant bit from at least one of the first or second registers.

8. The circuit of claim 6, further comprising a validate detected edge circuit to generate a control signal for the selection circuit to select outputs of the first or second state encoders based on:
   a state of a least significant bit from at least one of the first or second registers;
   a signal indicative of whether the second clock is high upon occurrence of the edge of the input periodic signal; and
   a signal indicative of whether the second clock is low upon occurrence of the edge of the input periodic signal.

9. A circuit, comprising:
   a ring oscillator;
   a state capture register, coupled to the ring oscillator, to capture a state of the ring oscillator upon occurrence of an edge of an input periodic signal;
   a first register to receive the captured state from the state capture register upon occurrence of one of a rising or falling edge of a first clock derived from the ring oscillator;
   a first state encoder, coupled to the first register, to read data from the first register, invert even numbered bits of the data read from the first register, and pad the data read from the first register, with the even numbered bits inverted, with a plurality of digital '1's;

a second register to receive the captured state from the state capture register upon occurrence of the other of the rising or falling edge of the first clock;

a second state encoder, coupled to the second register, to read data from the second register, invert odd numbered bits of the data read from the second register, and pad the data read from the second register, with the odd numbered bits inverted, with a plurality of logic '0's; and a selection circuit to select an output of the first state encoder or the second state encoder.

10. The circuit of claim 9, further comprising an edge-phase detector to assert an edge detect high signal in response to a second reference clock derived from the ring oscillator being high upon occurrence of the edge of the input periodic signal and to assert an edge detect low signal in response to the second reference clock derived from the ring oscillator being low upon occurrence of the edge of the input periodic signal, and wherein the first register includes an enable input that is coupled to receive the edge detect high signal and the second register includes an enable input that is coupled to receive the edge detect low signal.

11. The circuit of claim 10, wherein:

the ring oscillator includes a serially coupled plurality of delay elements;

the first clock is an output of one of the delay elements; and the second clock is an output of another one of the delay elements.

12. The circuit of claim 10, further comprising a validate detected edge circuit to generate a control signal for the selection circuit based on signals indicative of the edge detect high signal, the edge detect low signal, and a least significant bit of data from at least one of the first and second registers.

13. The circuit of claim 10, wherein the ring oscillator includes a plurality of delay elements and the edge-phase detector includes:

a first logic gate including first and second inputs and a first output, wherein the first input is coupled to an output of a first delay element of the ring oscillator and the second input is coupled to an output of a second delay element of the ring oscillator; and a first flip flop including a first flip flop data input and a first clock input, wherein the first flip flop data input is coupled to the first output of the first logic gate and the first clock input is to receive the input periodic signal.

14. The circuit of claim 13, wherein the edge-phase detector further includes:

a second flip flop including a second flip flop data input and a second clock input, wherein the second flip flop data input is coupled to the second output of the second logic gate and the second clock input is to receive the input periodic signal; and a second logic gate including third and fourth inputs and a second output, wherein the third input is coupled to an output of a third delay element of the ring oscillator and the fourth input is coupled to an output of a fourth delay element of the ring oscillator.

* * * * *